US009536286B2

(12) United States Patent
Cowan et al.

(10) Patent No.: US 9,536,286 B2
(45) Date of Patent: Jan. 3, 2017

(54) MAGNETIC RESONANCE METHOD AND TOMOGRAPHY SYSTEM FOR ACQUIRING IMAGE DATA SETS (71) Applicant: Siemens Aktiengesellschaft, Munich (DE)

(72) Inventors: Brett Cowan, Auckland (NZ); Andreas Greiser, Erlangen (DE); Arne Littmann, Erlangen (DE); Alistair Young, Auckland (NZ)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 14/283,492

(22) Filed: May 21, 2014

(65) Prior Publication Data
US 2014/0348406 A1 Nov. 27, 2014

(30) Foreign Application Priority Data
May 21, 2013 (DE) .................. 10 2013 209 295

(51) Int. Cl.
G06T 5/00 (2006.01)
G01R 33/565 (2006.01)
G01R 33/563 (2006.01)

(52) U.S. Cl.
CPC ......... *G06T 5/002* (2013.01); *G01R 33/56545* (2013.01); *G01R 33/56316* (2013.01)

(58) Field of Classification Search
None
See application file for complete search history.

(56) References Cited

U.S. PATENT DOCUMENTS 5,226,418 A 7/1993 Bernstein et al.
6,700,374 B1 3/2004 Wu et al.
(Continued)

FOREIGN PATENT DOCUMENTS

CN 1116078 A 2/1996
EP 1 139 114 A2 10/2001

OTHER PUBLICATIONS

O Friman, A Hennemuth, A Harloff, et al. "Probabilistic 4D blood flow tracking and uncertainty estimation," Medical Image Analysis 15 (2011): 720-728.*
(Continued)

*Primary Examiner* — Matthew Bella
*Assistant Examiner* — Soo Shin
(74) *Attorney, Agent, or Firm* — Schiff Hardin LLP (57) ABSTRACT In a method and a magnetic resonance tomography system, at least two temporally separate original data sets are acquired with one phase measurement value being acquired for each pixel in each original image data set. An optimization technique for the shared calculation of corrected phase values for the pixels in the data sets is implemented in a computer, wherein the corrected phase values of the pixels in a first of the data sets is in each case dependent at least on the phase measured value of the pixel at the same location in a second of the data sets which is recorded beforehand or afterwards, and the corrected phase values of the pixels in the second data set are in each case dependent at least on the phase measured value of the pixel at the same place in the first data set. Corrected image data sets are generated from the corrected phase values.

14 Claims, 3 Drawing Sheets

(56) References Cited

U.S. PATENT DOCUMENTS

| | | | |
|---|---|---|---|
| 7,342,397 B2* | 3/2008 | Pruessmann | G01R 33/5611 324/307 |
| 7,418,286 B2* | 8/2008 | Kumai | G01R 33/565 600/407 |
| 2003/0144589 A1 | 7/2003 | Roell | |
| 2006/0066307 A1 | 3/2006 | Hinks et al. | |
| 2007/0098298 A1 | 5/2007 | Xiang | |
| 2008/0012564 A1* | 1/2008 | Lin | G01R 33/4824 324/309 |
| 2009/0022380 A1* | 1/2009 | Zhao | G06T 3/4007 382/131 |
| 2010/0303320 A1* | 12/2010 | Roemer | A61B 5/055 382/131 |
| 2011/0142316 A1* | 6/2011 | Wang | G06T 11/006 382/131 |
| 2011/0156704 A1 | 6/2011 | Boernert et al. | |
| 2012/0249138 A1 | 10/2012 | Pfeuffer | |
| 2013/0181711 A1 | 7/2013 | Chaari et al. | |

OTHER PUBLICATIONS

Spottiswoode et al., "Tracking Myocardial Motion from Cine DENSE Images Using Spatiotemporal Phase Unwrapping and Temporal Fitting," IEEE Transactions on Medical Imaging, vol. 26, No. 1, Jan. 2007.*

Jenkinson, "Fast, Automated, N-Dimensional Phase-Unwrapping Algorithm," Magnetic Resonance in Medicine, vol. 49, pp. 193-197, 2003.*

Spottiswoode et al. Tracking Myocardial Motion From Cine DENSE Images Using Spatiotemporal Phase Unwrapping and Temporal Fitting: In IEEE Transactions on Medical Imaging, vol. 26, No. 1, pp. 15-30 (2007).

Young et al: "Generalized Spatiotemporal Myocardial Strain Analysis for DENSE and SPAMM Imaging", Magnetic Resonance in Medicine vol. 67; pp. 1590-1599, (2012;).

Ghiglia et al: "Robust two-dimensional weighted and unweighted phase unwrapping that uses fast transforms and iterative methods", J. Opt. Soc. Am. A, vol. 11 , No. 1 pp. 107-117 (1994).

Jenkinson: "Fast, Automated, N-Dimensional Phase-Unwrapping Algorithm"; Magnetic Resonance in Medicine vol. 40; pp. 193-197 (2003).

Witoszynskyj et al: "Phase unwrapping of MR images using UUN—A fast and robust region—A Fast and Robust Region Growing Algorithm", Medical Image Analysis vol. 13, pp. 257-268.( 2009).

Herraez et al: "Fast two-dimensional phase-unwrapping algorithm based on sorting by reliability following a noncontinuous oath" Applied Optics, vol. 41, No. 35, pp. 7437-7994; ( 2002.

* cited by examiner

MAGNETIC RESONANCE METHOD AND TOMOGRAPHY SYSTEM FOR ACQUIRING IMAGE DATA SETS

FIELD OF THE INVENTION

The invention relates to a method for recording image data sets with a magnetic resonance tomography system that has an image data acquisition device and a computing device.

DESCRIPTION OF THE PRIOR ART

In magnetic resonance tomography (MR tomography) a variety of different data acquisition techniques are used. Using these data acquisition techniques it is possible to map dynamic sequences in objects under examination. In the simplest case, such mapping of dynamic processes can be effected by data acquisition for a number of images within a short time. However, it is frequently desirable to examine movements of parts of the object, in particular of tissue fluids, more precisely.

To examine movements in particular, techniques are frequently used which evaluate not only the signal strength of the magnetic resonance signal but also take into account the phase of the signal. The two best known techniques that use the phase of an MR signal to analyze movement are velocity encoding (VENC) and displacement encoding with stimulated echoes (DENSE).

A significant problem when obtaining phase data is that, regardless of the type of measurement, the phase of a signal is restricted to a phase angle range of 360°. When this phase angle range is overshot or undershot, the phase jumps to the other end of the range. If, for example, a phase of 350° is measured with an MR tomography system in acquired data for a first image, and if this phase increases by 20° in the period until the next data acquisition takes place for the next image, a new phase of 10° would be measured. This obviously results in a distortion of the measured data The easiest way to avoid this type of distortion of the measured data is to perform the MR measurement such that the phase range to be measured is always limited. Both for velocity-encoded measurement and for displacement-encoded measurement with stimulated echoes, the phase contrast can be adjusted by setting a gradient field. Thus it is possible, for example, to perform a measurement several times in order to determine an optimum setting of the gradient field for the respective measurement. However, this extends the measuring times and restricts the maximum possible contrast, since a weaker magnetic field results in a lower phase contrast, and since normally a smaller phase range than the maximum phase range of 360° is used, in order even in the case of minor changes in the measured object to avoid "inversion" of the phase.

To be able to use larger gradient fields and thus to achieve a higher resolution, and for the restoration of data in which inversion of the phase has occurred in error, numerous techniques for phase reconstruction are known in the prior art. Many of the techniques for phase reconstruction, which is also called "unwrapping", are based on the idea that within a data set, which in the aforementioned techniques is frequently two-dimensional, the phase of at least one spatially adjacent pixel is corrected, starting from an initial pixel.

If it is assumed that the phase difference between two spatially adjacent pixels is never greater than ±180°, the correct phase of a pixel adjacent to the original pixel can be calculated such that the phase value of the adjacent pixel is subtracted from the phase value of the original pixel, the result is mapped by a modulo operation onto an angular range of ±180° and the resultant value is added to the phase of the original pixel. If the assumption is true that the phase difference between the pixels is never greater than ±180° and if the data is free from interference, a perfect reconstruction of the unwrapped phase is possible using this technique.

A disadvantage of this technique is that large measuring errors for individual pixels or a transition between two pixels in which a phase difference of more than ±180° occurs can significantly distort the result of the reconstruction. To prevent this, numerous approaches are proposed in the prior art which attempt to determine a path, wherein initially adjacent pixels are calculated which apparently have no measuring errors and hence can be readily reconstructed. In this way interference in the reconstruction can in many cases be prevented. However, this is not reliably possible for every input data set.

An alternative approach to unwrapping the phase of a measured data set is to choose an optimization approach wherein an attempt is made to optimize the phase of all points simultaneously. A simultaneous optimization is generally less susceptible to individual interference or ranges with large phase differences. Essentially it is also assumed in this optimization approach that the phase jump between two adjacent pixels is typically less than ±180°.

By making this assumption it is possible initially to calculate a phase difference for spatially adjacent pixels and to map this onto an angular range of ±180° using a modulo function. In a further step, an error value is initially calculated for each pair of pixels that contains adjacent pixels, by subtracting the previously calculated measured phase differences mapped onto an angular range of ±180° from the difference of the corrected phases for these pixels. The optimum corrected phase values for the individual pixels can then be calculated by simultaneously minimizing the error values, for example by minimizing the total of the squares of these error values. Such a method is described, for example, in Ghiglia, J. Opt. Soc. Am. A, Vol. 11, No. 1, 1994.

Such a simultaneous optimization of all selected phases is initially less susceptible to interference than local consideration in path-based techniques. Nevertheless problems occur, since with this type of technique the global phase of an individual image is not determined, as only relative phases are taken into account. In particular, phase jumps can also occur between these image data acquisitions when multiple image data sets are recorded. Even though large regions of an image are typically well reconstructed within an image, if noise is present several different regions which are each offset by a fixed phase can be generated. All these factors make it more difficult to interpret a generated MR data set.

BRIEF SUMMARY OF THE INVENTION

An object of the invention is thus to provide a method for data acquisition of image data sets with a magnetic resonance tomography system, wherein improved corrected image data sets are generated compared to known methods, in particular for noisy image data.

The object is achieved according to the invention by a method of the type described above that includes the following steps.

At least two temporally separate original image data sets are acquired using a data acquisition device (scanner) of the magnetic resonance tomography system, with one phase measurement value being acquired for each original image data set for each pixel.

An optimization technique for the shared calculation of corrected phase values for the pixels in the data sets is implemented in a computer, wherein the corrected phase values of the pixels in one of the data sets (arbitrarily designated as a "first" data set) is in each case dependent at least on the phase measured value of the pixel at the same location in another (a "second") of the data sets, which is acquired before or after the first data set. The corrected phase values of the pixels in the second data set are in each case dependent at least on the phase measured value of the pixel at the same place in the first data set.

Corrected image data sets are generated in the computer from the corrected phase values.

The method is based on the insight to not simply use the phase differences between spatially adjacent pixels in a data set, but in addition to use a similarity of temporally consecutive data sets that is normally present in measured data. If two data sets in a region are acquired within a short period of time, and if the phase of a measured point depends, for example, on the flow velocity of a fluid in the measured object, it can be expected that the flow velocity does not change dramatically between the data acquisitions, and that therefore only a minor phase change also occurs. Thus, for example, blood flow in a vein is always faster in the central region of the vein than at the edge, and at the edge there is also greater movement than in the surrounding tissue. Therefore, if it is the case in the first data set that a particular phase is measured at a pixel that, depending on the technique, may, for example, correspond to a particular movement of a part of the measured object with a particular movement velocity, it can then be assumed that in an image obtained shortly thereafter, a similar movement velocity is present and therefore also a similar phase is measured.

As mentioned in the introduction, in known techniques for minimizing the phase, it is assumed that the phase difference between spatially adjacent pixels is less than ±180°. Based on this assumption, a cost function for a value to be minimized is determined. If, as explained, it is now assumed that measured data detected at the same location also has similar phases in temporally consecutive data sets, it can also be assumed for such a pair of pixels that the phase difference between the phases of the pixels is less than ±180°. With this assumption, a cost function, which conventionally has taken into account only phase differences of spatially adjacent pixels within a data set, can be supplemented with additional terms that depend on the phase differences of pixels at the same location in temporally consecutive data sets.

Additionally taking phase differences for temporally adjacent pixels into account results in the phases of an individual pixel being determined not only, for example, by four spatial neighbors in a two-dimensional situation or six spatial neighbors in a three-dimensional situation, but additionally by temporal neighbors. Points in adjacent data sets that are spatially slightly offset compared to the originally considered point can also be taken into account. Due to this temporal link between the pixels, interference that occurs only in one individual data set has less impact, for example, than in standard phase unwrapping techniques. Furthermore, using the additional conditions that are predefined by taking into account the temporally adjacent data sets for the phase of a pixel, it is easier to identify any artifacts in the imaging or phase jumps of more than ±180°.

Taking into account the phase values in adjacent data sets can also be regarded as taking into account additional links in the system to be optimized. If, for example, the optimization is effected by minimizing a cost function, this results in the cost function no longer being decomposed into separately optimizable cost functions for the individual data sets.

In the inventive method, at least two temporally separate image data sets of an object under examination are initially acquired. The data sets may be data sets of a measuring method that encodes the displacement or velocity of the object to be measured, wherein the variable to be measured is encoded in the signal phase. Thus, for example, the movement of a heart, a respiratory movement, a blood flow, etc. can be measured. Any other MR examination in which phase information is obtained can of course also be performed. In the aforementioned time-resolved examination techniques mentioned, data are typically acquired in two dimensions, in k-space. This means that temporally very rapidly consecutive data sets can be measured. However, the method described can also be applied in time-resolved three-dimensional data acquisition. Depending on the measuring velocity the phase encoding strength can be adjusted in many techniques. In the case of DENSE and VENC measurements the strength of the phase contrast can be achieved, for example, by adjusting a strength of a bipolar encoding gradient.

Since the object of the inventive method is that for a large part of the pixels, the phase difference within an image and between two images is less than ±180°, significantly larger phase contrasts are possible compared to measurements not supported by a subsequent phase correction. As a result, the sensitivity of the techniques is significantly improved.

In the inventive method at least two, but typically more than two, temporally separate image data sets are acquired. A further object of the method is to generate corrected image data sets from the acquired image data sets, in which the measured phases are unwrapped. This means that in the corrected image data sets present at the end of the method the phase values of the points can cover a much larger range, for example of several 1000°. A reconstruction of these large phase differences is in particular advantageous, since thereby not only the phase values for an individual data set can be correctly determined, but also a correct phase relationship between the individual data sets can be achieved. Thus for example changes in movement velocities of parts of the object under examination can also be correctly identified.

The optimization technique that transfers the original data sets into the corrected image data sets is structurally similar to the optimization techniques known from the prior art, which simultaneously correct multiple phase values within a data set but, as explained, additionally exploits the fact that no phase jump is to be expected between consecutive image data sets in the same image region. If very small phase differences between the image data sets are expected, it is of course also possible to take into account more than one temporally adjacent image data set when correcting the phase values.

It is advantageous to perform the optimization technique by taking into account at least one constraint. In this case the technique is more robust in the presence of interference. Particularly in reconstruction techniques that optimize the phase values of all points simultaneously, for some of the pixels, differences normally occur between the unwrapped phase and the measured phase that are not integer quadruples of $2\pi$. The values determined therefore deviate unambiguously from the actual phase. The number of these values, however, can be significantly reduced by taking into account at least one additional constraint and in these circumstances the deviations become smaller.

The constraint may be that the corrected phase values of all pixels in the image data set acquired first are identical to the phase values of the pixels. This can be easily achieved, for example, in techniques in which the phase difference is gradient-dependent, by initially acquiring the data using small gradients. In techniques in which a phase difference increases over time, a number of intermediate images can be acquired, so that it can be assumed that no phase jump occurs in the first measured image data sets. Alternatively, it is also possible to predefine particular regions of all or of individual image data sets in which no phase jump is to be expected.

The constraint can be implemented, for example, when solving the optimization problem, by solving an equation system, with the corrected phase values for these points being permanently predefined as identical to the phase measured values. Alternatively it is possible to use other known techniques for using constraints in optimization problems, for example Lagrange multipliers.

The optimization technique preferably includes the following steps in the inventive method for acquiring image data sets.

Multiple first pairs of pixels are determined, each first pair of pixels consisting of a first pixel and a second pixel in one of the original data sets, the first pixel and the second pixel being adjacent.

Multiple second pairs of pixels are determined, each second pair of pixels consisting of a first pixel in one of the original data sets and a second pixel in another of the original data sets that map the same location, the original data set and the other original data set being acquired temporally consecutively.

An error value variable is determined for each pair of pixels, this error value variable depending on the phase measured values and the corrected phase values of the pixels in the pair of pixels.

A cost function is determined as a weighted p-norm of the error value variables of the pairs of pixels.

The corrected phase values are determined by minimizing the cost function.

As noted, the basic assumption in the inventive method is that both spatially and temporally adjacent pixels have a phase difference of less than ±180°. This means that in each case a condition is assigned to a pair of adjacent pixels. To formulate a cost function, namely the function that is to be minimized in the optimization technique, only pairs of pixels can be initially taken into account. The pairs of pixels taken into account decompose into two groups: the group of the first pairs of pixels each formed from adjacent pixels in an individual original data set, and the group of the second pairs of pixels each containing pairs of pixels from different, temporally adjacent data sets, but which map the same location.

In the optimization technique, the corrected phase values that are taken into account as variables should be optimized such that the predefined condition, namely that the phase difference between spatially and temporally adjacent pixels is less than ±180°, is readily fulfilled. Because this should be effected for a number of points simultaneously, a cost function is therefore determined that is a function of the corrected phase values and of the phase measured values of the pixels in the data sets. Because pairs of pixels that are spatially and temporally adjacent are taken into account, it is advantageously possible in the inventive method to determine an error value variable for each of these pairs, and in turn to calculate the cost function from these error value variables. The cost function can be a weighted p-norm of the error variable, with the weighted p-norm being calculated as a weighted total of the Pth power of the amounts of all error value variables. By selecting the power P, it is possible to determine whether individual high error value variables should be weighted particularly strongly or particularly weakly. Small values for P, which are greater than 1 but significantly smaller than 2, result in a very small weighting of individual high error value variables. This may be advantageous if it can be expected that the phase values for individual pixels deviate strongly or many individual phase jumps are to be expected in the image. Very high values for P, which are greater than 2 result in a strong weighting of individual high error value variables.

The inventive method may in particular entail a weighting of the individual terms of the p-norm. The weighting is effected by choosing a multiplier factor for some or all of the Pth powers of the error values in the total. Thus it is possible to give a lower weighting to areas in which large measured errors are to be expected, such as certain types of tissue, areas with low homogeneity of the magnetic field, etc. Likewise areas whose phase information is particularly essential may be weighted more strongly.

It is advantageous in the inventive method for the error value variable to be determined by the following steps.

A measured phase difference is calculated by applying a modulo operation to the difference between the phase measured values of the first and of the second pixel in the pair of pixels, with an offset being added before applying the modulo operation and the same offset being subtracted after the offset operation A corrected phase difference is determined by subtracting the corrected phases of the first and of the second pixel in the pair of pixels.

The error value variable is determined by subtracting the measured phase difference from the corrected phase difference.

If the error value variable is determined using these method steps, this corresponds to the condition mentioned in the introduction that the angular jump between two adjacent pixels does not exceed certain values.

In particular when calculating the measured phase difference the measured phase difference may be between ±180° regardless of the phase measured values of the pixels for which it is calculated. Depending on the type of calculation other ways of stipulating the phase angle are of course also possible, for example ±π, etc.

If the mapping is effected by the modulo operation onto this phase angle range, the value of the error value variable corresponds to the strength of the deviation from the original assumption that the phase difference between adjacent pixels is less than ±180°.

In particular the p-norm in the inventive method can be a 2-norm. The 2-norm is suitable in this context for error determination, since individual error values are weighted neither disproportionately strongly nor disproportionately weakly. In addition the optimization problem can frequently be solved particularly efficiently for the 2-norm.

To achieve a consistent adjustment of the phases of all pixels in all recorded data sets it is advantageous if for each pixel in each data set at least one pair of pixels is formed which includes the pixel. If a pixel is not contained in a pair of pixels, the phase of this pixel cannot be corrected. Although in individual cases this may be desirable for pixels at the edge of the image region, etc., generally a consistent correction of the phase of the pixels is desirable.

The image data sets can in particular be two-dimensional image data sets. Two-dimensional image data sets are frequently sufficient, for example to display one-dimensional flow velocities of media, etc. At the same time, data acquisition two-dimensional image data sets permits high-frequency data acquisition of image data sets, as a result of which small phase differences between temporally adjacent image data sets can be assumed.

To minimize the cost function, an iterative technique can in particular be used to solve linear equation systems. Typically the equation systems to be solved in the inventive method are relatively thinly populated, in other words only relatively few variables are linked per equation. Such equation systems can be particularly well solved using iterative techniques.

In particular the iterative technique may be a preconditioned technique of conjugated gradients with preconditioning matrix. While the equation systems to be solved or the matrices to be diagonalized are very thinly populated in the inventive method, they are at the same time very large. If for example 15 data sets containing 32×32 pixels per data set are to be optimized, the matrix display of the resulting equation system is 45,120×15,560 entries in size and has 89,216 entries which are not zero. In an acquisition of three-dimensional data sets far more extensive equation systems must be solved. Because of these very large matrices and the consequent long computing time it is desirable to optimize calculations as much as possible. In many cases it is possible to find a rapidly converging technique using a technique for conjugated gradients. To solve the equation systems in the inventive method, preconditioning by a preconditioning matrix is however typically necessary for this purpose.

The preconditioning matrix can be determined, for example, by solving an unweighted minimization problem. Thus, for example, a minimization problem can be solved that corresponds to the total minimization system to be solved both in the choice of the p-norm and in the way of calculating the error values. Thus the only difference between solving the total equation system to be solved in the optimization technique and solving the preconditioning matrix is the fact that to calculate the preconditioning matrix the individual powers of the error value variables are not evaluated. Thus the optimization problem is approached with a cost function that represents an unweighted p-norm of the calculated error variables.

The unweighted minimization problem can be solved under a constraint, in particular under the constraint that the corrected phase values of all pixels in the image data set acquired first are the same as the phase measured values of those pixels. This is particularly advantageous if the same constraint is also to be used for the optimization technique overall.

To calculate the inverse preconditioning matrix it is possible to use a Cholesky decomposition. The Cholesky decomposition is particularly suitable for solving minimization problems when using the least squares method. Accordingly the Cholesky decomposition can in particular be used when the p-norm is a 2-norm.

In addition the present invention relates to a magnetic resonance tomography system, having an image data acquisition device and a computing device, the computing device being designed to generate corrected image data sets therefrom in accordance with the described method.

DESCRIPTION OF THE PREFERRED EMBODIMENTS

Figure 1:
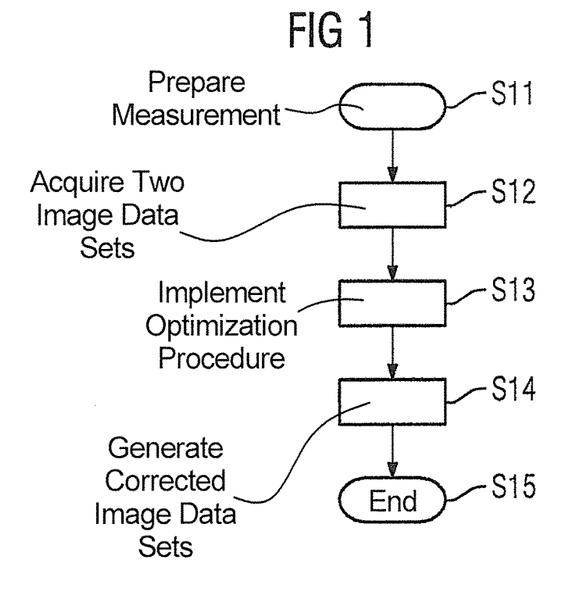
FIG. 1 is a flowchart of an exemplary embodiment of an inventive method.

FIG. 1 is a flowchart of a method for acquiring image data sets by operation of a magnetic resonance tomography system. In step S11 an object under examination is introduced into the MR tomography system before the start of the procedure. Furthermore, further preparatory steps, such as arranging local coils, positioning the object under examination, choosing measurement protocols, etc., can be performed in step S11.

In step S12 at least two image data sets are acquired using the chosen measurement protocol. Image data sets from different measurement techniques can be acquired. The correction of the phases effected in the subsequent procedure is particularly advantageous in velocity-encoded measurements or in measurements in which displacement encoding with stimulated echoes is effected. However, in principle data sets can be recorded in step S12 using any measurement technique in which the phase of the MR signal is to be evaluated.

The basic principles for the acquisition of MR tomography data is known to those skilled in the art and thus need not be explained herein in detail. The only essential thing for the method described is that the phase information of the MR signal is to be evaluated. Such phase information can contain, for example, information about material properties. In particular when overlaying an additional gradient field phase information can however also be used to determine movement or displacement information.

In some cases it may be advantageous to acquire a reference image in step S12, in which it is assumed that the phase differences between the nuclear spins examined are all in a range of ±180°, in other words that there is no inversion of the phase. If it is known of an acquired image that there is no inversion of the phase within the image, a constraint in connection with the reconstruction of the phases can advantageously be determined from this image, as a result of which the result of the reconstruction can be improved. In particular, in measurement techniques based on velocity encoding or displacement encoding with an additional magnetic field, the strength of this additional magnetic field can initially be chosen such that only a small phase contrast is generated. If then the strength of the gradient field is increased, as a result of which the contrast is improved, it is possible that the phase values invert, but since an image with a known phase is present it is generally possible to reconstruct the actual phase of the examined nuclear spins.

After acquiring at least two, preferably more than two, temporally separate original image data sets, an optimization procedure (algorithm) is performed in step S13, in order to correct the phase values. A correction of the phase values here means that the phase values of a pixel which during measurement are in principle restricted to a phase angle range of ±180° are reconstructed such that a larger phase range is covered. If, for example, the initial phase at a pixel is 0 and a number of images is recorded, wherein the phase changes by 150° for each image, the actual phases of the first four images are 0°, 150°, 300° and 450°. If the phase range of ±180° is now recorded with a detector, phase values for the pixel of 0°, 150°, −60° and 90° are measured by the magnetic resonance tomography system. In particular the transition from the second to the third data set, in other words jumping the angle from 150° to −60°, can easily be misinterpreted. Hence the phases should be corrected in connection with the MR data acquisition. The optimization technique should ideally reconstruct the original phases, i.e. 0°, 150°, 300° and 450°.

An essential feature of the optimization technique is that it is not applied to every individual data set, but that at least the phases of the pixels in a preceding or a subsequent data set are also used to reconstruct the phases of a data set. As this use of phase values of adjacent data sets is effected reciprocally, the phase values are linked between the data sets. The optimization problem that, for example, can be expressed as minimization of a cost function cannot thus be separated such that it can be solved separately for each individual data set.

One possible approach to the simultaneous optimization of the corrected phase values of all pixels is to set up a cost function on the basis of the requirement that the phase difference between spatially and temporally adjacent pixels is normally a maximum of ±180°. One possible implementation is explained below in the text with reference to FIG. 3 and FIG. 4.

After corrected phase values are determined in step S13 for at least some of the pixels in the data sets and thus ideally the original phase of the nuclear spins has been recorded at the location at which and at the time at which the pixel was recorded, corrected image data sets can be generated in step S14.

The optimization problem solved in step S13 is normally relatively complex. Hence it is advantageous to take into account in step 13 only the phases of the individual measured points. Furthermore it may be advantageous to choose the display of the phase values of the pixels in the data sets such that an optimization is particularly efficiently possible. In step S14 it is hence in particular possible to link the corrected phase values again to other image data, such as for example signal amplitudes at the pixels and furthermore to transfer the data to a standard format and/or so arrange it that it is readily suitable for further processing. It is also possible for the data in step S14 to be provided in a format that corresponds to the format of the original data acquisition. In this case the corrected image data sets can if required be compared directly with the original data sets. On the other hand it is also possible to adapt the data so that it is particularly readily suitable for further processing.

The method ends in step S15 and the image data sets corrected in step S14 are in particular provided for evaluation or further processing. The evaluation or further processing can for example be effected directly on the same device, promptly where necessary, i.e. in virtually real time, but the data can also be initially stored or transferred to another location.

Figure 2:
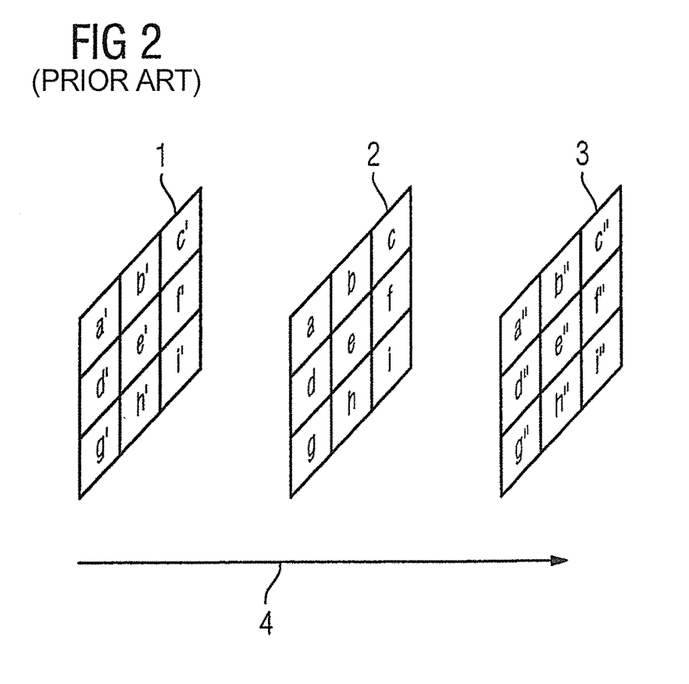
FIG. 2 schematically illustrates a number of temporally separate image data sets.

FIG. 2 schematically shows three image data sets 1, 2, 3 which are recorded temporally separately. For example, the data sets are illustrated here as two-dimensional data sets. Arrow 4 shows the progression of time, wherein first data set 1 is recorded, data set 2 being recorded temporally separately and lastly data set 3 being recorded temporally separately. For example, a structure comprising nine pixels is shown for each of the image data sets 1, 2, 3. Image data set 2 includes the pixels a, b, c, d, e, f, g, h and i. Image data set 1 consists of the corresponding pixels, wherein pixels at the same position are identified with the same letters and characterized with a stroke. Likewise the designations of the pixels in image data set 3 are characterized by two strokes. In actually recorded image data sets a resolution higher than 3×3 pixels is normally chosen and frequently more than three image data sets are also recorded temporally separately. It is also possible for the data sets to have a higher or lower dimension and for example to be three-dimensional. The small number of pixels illustrated is for reasons of clarity.

In connection with the optimization technique which is part of the data acquisition technique already explained, phase differences between adjacent pixels are taken into account. This means that both the phase differences between spatially adjacent pixels, for example the pairs of pixels ef, eb, ed and eh, are taken into account, as well as the phase differences between temporally adjacent pixels, for example the pairs of pixels ee' and ee".

In the resultant optimization problem the corrected phase value of a pixel through multiple stages of the dependency may also be dependent on spatially and temporally more remote pixels. If for example the phase difference between the pixels d' and e' is optimized, this may alter the phase of the pixel e', as a result of which in turn the phase difference between the pixels e' and e alters. Because of these multiple dependencies a direct calculation of the corrected phase is in many cases not possible. It is hence an object of optimization for example to solve the minimization of a cost function. This is described in greater detail below.\

Figure 3:
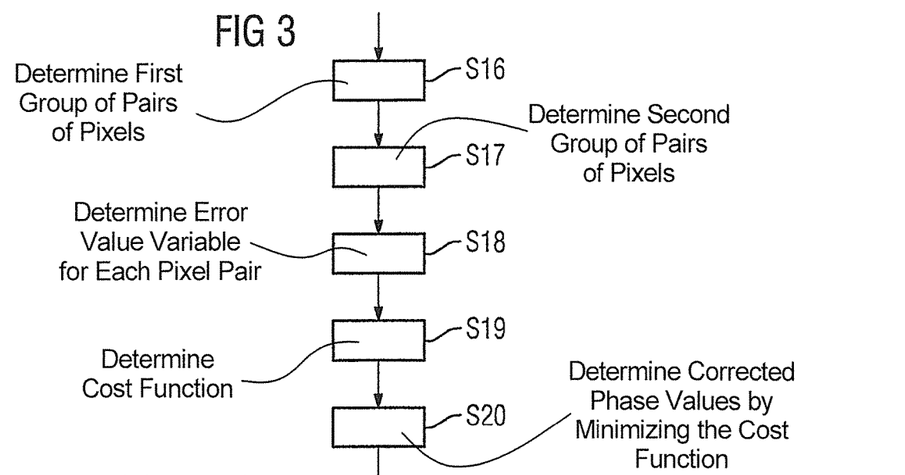
FIG. 3 is a flowchart of the optimization technique of an exemplary embodiment of the inventive method.

FIG. 3 shows a flowchart of an optimization technique for an exemplary embodiment of a method for data acquisition image data sets by means of an MR tomography system. With the help of the optimization technique shown it is possible to solve an optimization problem, as was explained with reference to FIG. 2. The steps S16 to S20 shown represent one possibility for the sequence of the optimization technique designated as S13 in FIG. 1.

In step S16 a first group of pairs of pixels is initially determined. This group of pairs of pixels consists of pairs of pixels in which a first and a second point in the pair of pixels each originate from the same original data set. The first pixel is adjacent to the second pixel. These pairs of pixels are used in the further procedure in order to optimize the change in the phase in the spatial directions. Pixels are frequently recorded in a rectangular grid. In this case pairs of pixels from adjacent pixels can be formed along each of the two spatial directions of a two-dimensional data set or along each of the three spatial directions of a three-dimensional data set. It is, however, also possible to form pairs of pixels along the diagonals, or to adapt the conditions of adjacency in the geometry of the pixels, if a non-rectangular data acquisition grid is chosen.

The pairs of pixels can be entered explicitly as a list into a memory or stored therein in a format that corresponds to the implementation of the further procedure as closely as possible. It is however also possible for this first group to be determined purely abstractly, in other words for the pairs of pixels not to be explicitly saved as such anywhere, but for it also to be possible for the adjacent pairs of pixels to be identified at propagation time and for the adjacency of the pixels not to be taken into account until later in the procedure.

In step S17 a second group of pairs of pixels is formed, whereby the temporally adjacent pixels belong to this group. The temporal adjacency of the pixels has already been explained with reference to FIG. 2. It is of course also possible to take into account, in addition to pixels at identical positions in a temporally preceding or following image data set, those pixels which are offset both temporally and spatially compared to the other pixel in the pair of pixels. What was said about the first group applies for the type of storage.

In step S18 an error value variable is determined for each of the pairs of pixels. The error value variable is a variable because it is dependent on the corrected phase values of the pixels in the pair of pixels. Hence the error value variable cannot be expressed as a numerical value, but instead represents a variable which is dependent on other variables still to be optimized. Besides the corrected phase values the error value variable is also dependent on the phase measured values of both the pixels in the pair of pixels. In typical implementations the error value variable is a measure of how much the difference between the corrected phase values of the pixels deviates from the difference in the phase measured values of the two pixels mapped onto an angular range from −180° to +180°.

In step S19 a cost function is determined, which is then minimized for execution of the optimization. For example, a weighted p-norm of the error value variables of the pairs of pixels can be determined as a cost function. This will be explained by way of example for the two-norm.

If the cost function is a two-norm, the optimization technique can be regarded as fitting the corrected phase values using the least squares method. If the measurement was completely interference-free and the condition that the phase difference between adjacent pixels is never greater than ±180° is always satisfied, the error value variables, the calculation of which is explained more fully below with reference to FIG. 4, would all be zero and the cost function would therefore also be zero.

The cost function would in the case of the two-norm therefore minimize the standard deviation of the error value variables for all pairs of pixels. However, this corresponds precisely to the procedure in the least squares method.

It is frequently the case with real measured data that the measured data is particularly strongly error-prone at certain periods or in certain spatial regions. This is the case, for example, for MR measurements in regions in which it is known that the magnetic field is non-homogeneous, or in which strong undirected movements may occur. When calculating an unweighted p-norm to determine the corrected phase values these errors would impact strongly on the other phase values in the pixels in the data sets. With the help of a weighted p-norm it is possible to apply particularly low weighting to regions in which large errors are expected or to apply particularly high weighting to domains in which the determination of correct phases is particularly important. When weighting a p-norm the Pth power of the corresponding error value is weighted in the total with a prefactor, whereby a large prefactor means that this error value is taken particularly strongly into account when optimizing the corrected phase values.

In step S20 the corrected phase values are determined by minimizing the cost function. The simplest method for optimizing a cost function is to derive the cost function in line with all optimization parameters, i.e. in line with the corrected phase values, and then for example to use a downhill method to correct the phase values such that the value of the cost function falls as much as possible and to repeat this procedure until the corrected phase values only change imperceptibly. The disadvantage of such a procedure is that normally only local minima of the cost functions are found. In the prior art a variety of techniques are known for how such minimization can be improved.

Alternatively it is possible, to minimize the cost function, for an equation system determined by the cost function to be solved. In this case the solution of the optimization problem is possible using techniques for matrix diagonalization. Since the matrices in the technique described are normally very thinly populated, since the phase values of the individual pixels are each linked only to the phase values of the adjacent pixels, particular use can be made here of calculation techniques which are suitable for diagonalizing thinly populated matrices.

In particular an iterative technique, for example a preconditioned technique of conjugated gradients with a preconditioning matrix, can be used. A preconditioning matrix is particularly necessary if a weighted p-norm is used as a cost function.

Unweighted p-norms, in particular unweighted 2-norms, can already be solved without a preconditioned matrix. Because a preconditioning matrix should have a solution similar to the problem to be solved, the solution of the unweighted minimization problem can therefore be used to determine the preconditioning matrix. Because however this preconditioning matrix is very large, the inversion of the matrix necessary for use in the procedure of the preconditioned conjugated gradients is very compute-intensive. Hence the preconditioned matrix can be inverted in particular by a Cholesky decomposition, as a result of which the calculation of the preconditioning matrix can be significantly accelerated.

In summary, the optimization problem can be solved in the optimization technique in particular with known methods of matrix calculation if a weighted 2-norm of the error value variables is used as a cost function.

Figure 4:
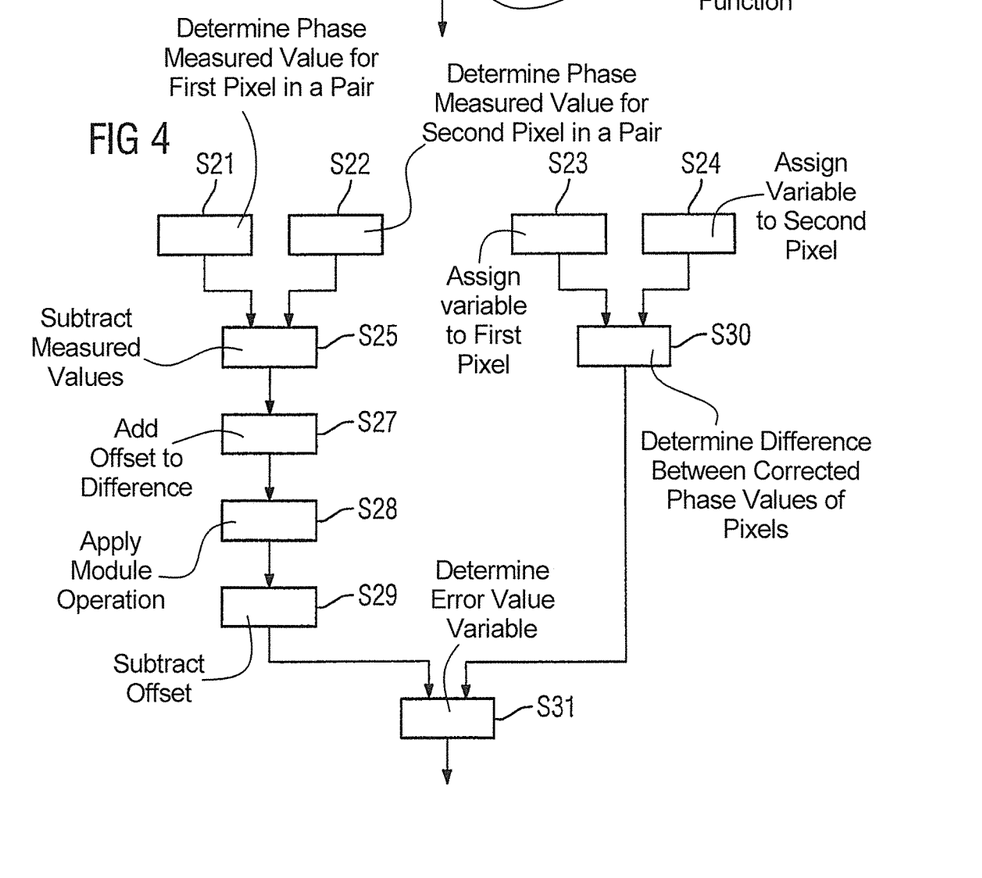
FIG. 4 is a flowchart for determining the error value variable in an exemplary embodiment of the inventive method.

FIG. 4 shows a flowchart of an exemplary embodiment for calculating the error value variable for a pair of pixels. The calculation shown of the error value variable results in an error value variable which indicates the difference between the difference of the corrected phase values and the difference of the phase measured values of the pairs of pixels mapped onto a space of ±180°. Such a calculation of the error value variables corresponds to the condition for optimizing the phases that no phase jumps of more than ±180° occur between spatially and temporally adjacent pixels.

To calculate the error value variable the phase measured value for the first pixel in the pair of pixels is initially determined in step S21, and the phase measured value for the second phase measured value of the pair of pixels in step S22. In steps S23 and S24 variables, for example, storage locations or registers, are determined that are assigned to the first and second corrected phase value. The first and second phase measured values are subtracted from one another in step S25. If for example the first phase measured value is 150° and the second phase measured value is 120°, a value of 30° is determined as the result in step S25.

An offset is added to this difference in step S27. This offset can in particular be 180° or π. In step S28 a modulo operation is applied to this offset difference, which maps the value onto an interval between 0 and 360° or 0 and 2π. The offset added in step S27 is subtracted again in step S29.

Adding and subtracting an offset is necessary because the value of the difference should be restricted to a bipolar range between −180° and +180°. However, modulo operations in principle map a value range onto a value range between 0 and another positive number. By adding an offset of 180°, then applying a modulo operation and then subtracting the offset from 180° it is possible to map the difference value onto a value range from −180° to +180°.

In step S30 the difference between the corrected phase values of the pixels in the pair of pixels is determined. Note that the corrected phase values are variables, as already explained. Hence in step S30 only a linking of variables is determined and the value determined in step S30 must be determined anew in each case if the corrected phase values are adjusted.

In step S31 the value determined in step S29 is subtracted from the variable determined in step S30, to obtain an error value variable as the result of step S31.

Figure 5:
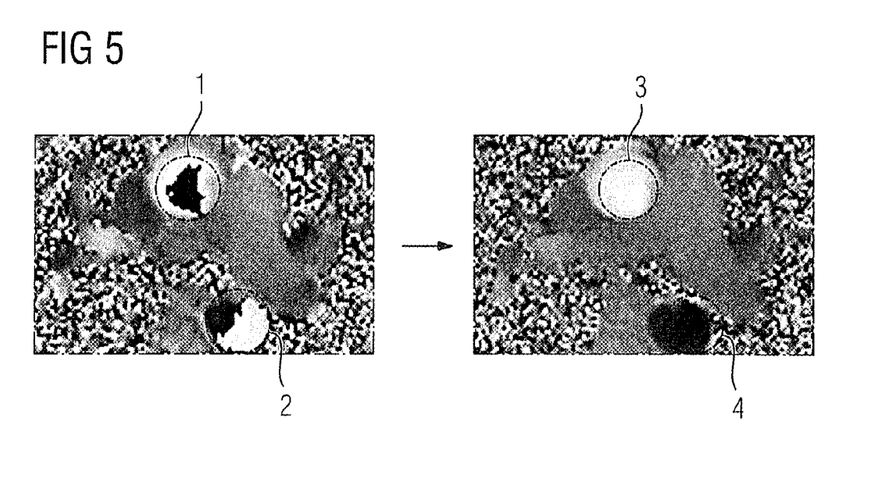
FIG. 5 shows an example of the unwrapping of a phase using the inventive method.

FIG. 5 shows the effects of the phase correction on an image data set. Shown on the left-hand side of FIG. 5 is an original data set which has phase jumps at the marked locations 1 and 2. The image data set shown originates from a data acquisition to determine a flow velocity. Using an additional gradient field the phases have been encoded such that a measured phase corresponds to a flow velocity. The image represents the phases and therefore the flow velocities. For example, a light-colored region with a flow toward the observer can be identified here, along with a dark-colored region with a flow away from the observer.

After measuring the data an illustration can initially be seen in the original data set shown on the left, in which it appears as if an inner region exhibiting a flow away from the observer lies in the region 1 inside a region exhibiting a rapid flow toward the observer. The same applies in the reverse direction for region 2.

This apparent reversal of a flow within a mapped vessel is a measuring artifact generated by an inversion of the phase. To prevent such artifacts an attempt can be made using a described procedure for reconstructing the original phase to achieve a representation which corresponds to the actual measured phases and therefore to the actual velocities.

The right image in FIG. 5 shows the data set shown on the left side of FIG. 5 after application of the described optimization technique for calculating corrected phase values. It can now be seen here that in region 3, which marks the same region of the image as region 1 in the other image, a particularly rapid flow toward the observer can be observed. Likewise the artifact in region 2 has been corrected in the corresponding region 4. Therefore a successful correction of the data set was possible using the described method.

Figure 6:
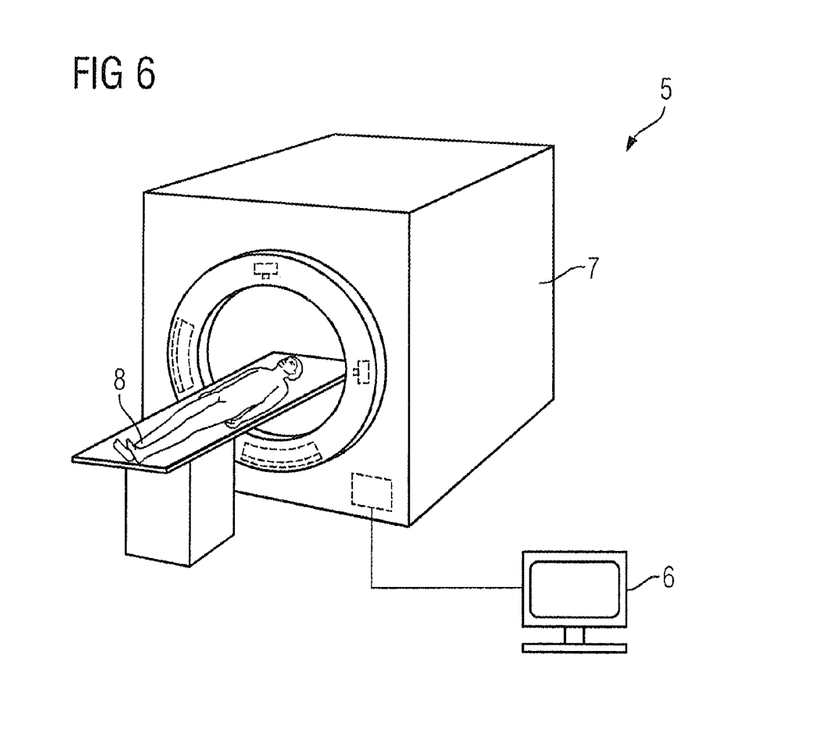
FIG. 6 shows an inventive MR tomography system.

FIG. 6 shows an MR tomography system which is designed to execute the described method. The MR tomography system 5 includes a computing device 6 and an image data acquisition device 7. The image data acquisition device 7 is used to record data sets of the object under examination 8 which are controlled by the computing device 6. After data acquisition at least two temporally separate original image data sets which include phase measured values for each pixel, the computing device 6 can be used to execute the described optimization technique and corrected image data sets can be generated. Therefore using the MR tomography system shown a significant improvement in imaging can be achieved in phase-data acquisition MR techniques.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for acquiring magnetic resonance (MR) image data, comprising:
   operating an MR data acquisition device to acquire at least two temporally separate raw data sets, each representing a plurality of pixels, with one phase measurement value being acquired for each pixel in each raw image data set;
   providing said raw image data sets to a processor and, in said processor, executing an optimization algorithm for shared calculation of corrected phase values for the pixels in the respective raw image data sets, with corrected phase values for the pixels in a first of the raw image data sets, for each pixel, being dependent on at least one the phase measurement value of the respective pixel at a same location in a second of the raw image data sets acquired before or after said first of said raw image data sets, and with corrected phase values of the respective pixels in the second of the raw image data sets, for each pixel, being dependent on at least one the phase measurement value of the pixel at the same location in said first of said raw image data sets;
   executing said optimization algorithm with an algorithm constraint that corrected phase values of all pixels in said first of said raw image data sets are identical to the phase measurement values of said pixels; and
   in said processor, generating corrected image data sets from the corrected phase values, and making the corrected image data sets available in electronic form at an output of said processor.

2. The method as claimed in claim 1 comprising, in said optimization algorithm:
   determining a plurality of first pairs of pixels, wherein each first pair of pixels consists of a first and a second pixel in one of the original data sets, the first pixel and the second pixel being adjacent,
   determining a plurality of second pairs of pixels, wherein each second pair of pixels consists of a first pixel in one of the original data sets and of a second pixel in another of the original data sets which map the same location, the original data set and the other original data set being recorded temporally consecutively;
   determining an error value variable for each pair of pixels, said error value variable depending on the phase measured values and the corrected phase values of the pixels in the pair of pixels;
   determining a cost function as a weighted p-norm of the error value variables of the pairs of pixels; and
   determining the corrected phase values by minimizing the cost function.

3. The method as claimed in claim 2 comprising determining said error value variable by:
   calculating a measured phase difference by applying a modulo operation to the difference between the phase measured values of the first and of the second pixel in the pair of pixels, wherein an offset is added in particular before applying the modulo operation and the same offset is subtracted after the offset operation;
   determining a corrected phase difference by subtracting the corrected phases of the first and of the second pixel in the pair of pixels; and
   determining the error value variable by subtracting the measured phase difference from the corrected phase difference.

4. The method as claimed in claim 3 comprising calculating said measured phase difference between ±180° regardless of the phase values of the pixels for which said phase difference is calculated.

5. The method as claimed in claim 2 comprising minimizing said cost function using an iterative technique for solving linear equation systems.

6. The method as claimed in claim 5 comprising using, as said iterative technique, a preconditioning technique of conjugated gradients with a preconditioning matrix.

7. The method as claimed in claim 6 comprising determining said preconditioning matrix by solving an unweighted minimization problem.

8. The method as claimed in claim 7 comprising solving said unweighted minimization problem under a constraint that corrected phase values of all pixels said first of said raw image data sets are identical to phase measurement values of said pixels.

9. The method as claimed in claim 6 comprising, in said preconditioned technique of conjugated gradients, calculating an inverse of said preconditioning matrix using a Cholesky decomposition.

10. The method as claimed in claim 9 comprising using a two-norm as said p-norm.

11. The method as claimed in claim 2 comprising using a two-norm as said p-norm.

12. The method as claimed in claim 1 comprising, for each pixel in each raw image data set, forming at least one pair of pixels that includes the respective pixel.

13. The method as claimed in claim 1 comprising acquiring said raw image data sets as two-dimensional raw image data sets.

14. A magnetic resonance (MR) tomography apparatus comprising:

an MR data acquisition unit;

a processor configured to operate the MR data acquisition device to acquire at least two temporally separate raw data sets, each representing a plurality of pixels, with one phase measurement value being acquired for each pixel in each raw image data set;

said processor being provided with said raw image data sets to a processor, said processor being configured to execute an optimization algorithm for shared calculation of corrected phase values for the pixels in the respective raw image data sets, with corrected phase values for the pixels in a first of the raw image data sets, for each pixel, being dependent on at least one the phase measurement value of the respective pixel at a same location in a second of the raw image data sets acquired before or after said first of said raw image data sets, and with corrected phase values of the respective pixels in the second of the raw image data sets, for each pixel, being dependent on at least one the phase measurement value of the pixel at the same location in said first of said raw image data sets;

said processor being configured to execute said optimization algorithm with an algorithm constraint that corrected phase values of all pixels in said first of said raw image data sets are identical to the phase measurement values of said pixels; and said processor being configured to generate corrected image data sets from the corrected phase values, and to make the corrected image data sets available in electronic form at an output of said processor.

* * * * *